(12) United States Patent
Matsubara et al.

(10) Patent No.: US 10,944,395 B2
(45) Date of Patent: Mar. 9, 2021

(54) DRIVING APPARATUS AND SWITCHING APPARATUS

(71) Applicant: FUJI ELECTRIC CO., LTD., Kanagawa (JP)

(72) Inventors: Kunio Matsubara, Hino (JP); Hirotoshi Kaneda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/705,223

(22) Filed: Dec. 6, 2019

(65) Prior Publication Data

US 2020/0112306 A1 Apr. 9, 2020

Related U.S. Application Data

(62) Division of application No. 15/955,685, filed on Apr. 18, 2018, now Pat. No. 10,505,535.

(30) Foreign Application Priority Data

May 1, 2017 (JP) .............................. JP2017-091478

(51) Int. Cl.
| | | |
|---|---|---|
| *H03K 17/082* | (2006.01) | |
| *H03K 17/28* | (2006.01) | |
| *H03K 17/16* | (2006.01) | |

(52) U.S. Cl.
CPC ......... *H03K 17/28* (2013.01); *H03K 17/0822* (2013.01); *H03K 17/162* (2013.01); *H03K 17/168* (2013.01)

(58) Field of Classification Search
CPC .. H03K 17/28; H03K 17/0822; H03K 17/168; H03K 17/162; H02M 1/083; H02M 2001/058; H02M 3/1588; H01L 2924/00; G09G 3/3233; H09G 2300/0819
See application file for complete search history.

(56) References Cited

U.S. PATENT DOCUMENTS

| | | | |
|---|---|---|---|
| 2007/0115038 A1 | 5/2007 | Higashi | |
| 2010/0237841 A1 | 9/2010 | Matsuo | |
| 2015/0282290 A1* | 10/2015 | Borowy | H05H 1/36 219/121.39 |
| 2016/0209853 A1* | 7/2016 | Deboy | H02M 1/08 |
| 2017/0093392 A1 | 3/2017 | Kobayashi | |

FOREIGN PATENT DOCUMENTS

| | | |
|---|---|---|
| JP | 4742828 B2 | 8/2011 |
| JP | 5516705 B2 | 6/2014 |
| JP | 2015204659 A | 11/2015 |

* cited by examiner

*Primary Examiner* — Sibin Chen

(57) ABSTRACT

A driving apparatus including: gate driving circuit to drive gates of a first semiconductor element and a second semiconductor element connected in series between a positive side power supply line and a negative side power supply line; a first timing generating circuit to generate a first timing signal when voltage applied to the second semiconductor element becomes reference voltage during a turn-off period of the first semiconductor element; and a first driving condition change circuit, wherein the gate driving circuit relaxes change in a charge amount of the gate of the first semiconductor element, according to the first timing signal.

7 Claims, 5 Drawing Sheets

DRIVING APPARATUS AND SWITCHING APPARATUS

CROSS-REFERENCE TO RELATED APPLICATIONS

This application is a divisional of U.S. patent application Ser. No. 15/955,685, filed on Apr. 18, 2018, which claims priority to Japanese Patent Application No. 2017-091478, filed on May 1, 2017, the contents of each of which are hereby incorporated herein by reference in their entirety.

BACKGROUND

1. Technical Field

The present invention relates to a driving apparatus and a switching apparatus.

2. Related Art

Conventionally, for a driving apparatus to drive each of gates of two semiconductor elements connected in series, various techniques for turning off the semiconductor elements while reducing turn-off loss, surge voltage etc. have been proposed. For example, a driving method to reduce the surge voltage while preventing the turn-off loss from increasing by changing driving conditions when voltage of the semiconductor element to be made turned off becomes power supply voltage Ed is disclosed (refer to the patent document 1 to 3, for example). This method utilizes that commutation of current into the other semiconductor element connected in series starts when voltage of the semiconductor element to be made turned off becomes the power supply voltage Ed.

Patent document 1: Japanese Patent No. 5516705 specification.
Patent document 2: Japanese Patent Application Publication No. 2015-204659.
Patent document 3: Japanese Patent No. 4742828 specification.

However, the faster a switching speed of the semiconductor element becomes, the greater influence of main circuit wiring inductance is, so at the timing when voltage of the semiconductor element during turn-off becomes the power supply voltage, commutation of current into the other semiconductor element does not necessarily start. That is, even though the driving condition is changed at this timing, trade-off between the above-described turn-off loss and the surge voltage becomes difficult to be improved.

SUMMARY

A first aspect of the present invention may provide a driving apparatus. The driving apparatus may include a gate driving circuit to drive the gates of a first semiconductor element and a second semiconductor element connected in series between a positive side power supply line and a negative side power supply line. The driving apparatus may include a first timing generating circuit to generate a first timing signal when voltage applied to the second semiconductor element is reduced and becomes lower than or equal to reference voltage during a turn-off period of the first semiconductor element. The driving apparatus may include a first driving condition change circuit to relax change in charge amount of the gate of the first semiconductor element by the gate driving circuit, according to the first timing signal.

The driving apparatus may further include a first determination circuit which determines whether voltage applied to the second semiconductor element becomes the reference voltage or not. The first timing generating circuit may generate a first timing signal, according to the determination that the voltage applied to the second semiconductor element has been lower than or equal to the reference voltage.

The driving apparatus may further include a first insulation signal transmitting unit provided between the first determination circuit and the first driving condition change circuit.

The first timing generating circuit may be pre-adjusted so as to generate a first timing signal when, after receiving a control signal to turn off the first semiconductor element and starting turn-off of the first semiconductor element, time reaches a timing before voltage applied to the second semiconductor element is reduced and becomes lower than or equal to the reference voltage.

The first timing generating circuit may generate a first timing signal having a predetermined pulse width. The first driving condition change circuit may reduce a speed at which the gate driving circuit changes charge of the gate of the first semiconductor element, while the first timing signal is generated after receiving the first timing signal.

The first timing generating circuit may end generating the first timing signal before turn-off of the first semiconductor element ends. The reference voltage may be 0 V.

The driving apparatus may further include a determination circuit to determination whether voltage applied to the second semiconductor element becomes lower than or equal to the reference voltage or not, during a turn-off period of the first semiconductor element.

A second aspect of the present invention may provide a switching apparatus. The switching apparatus may include the driving apparatus in the first aspect. The switching apparatus may include a first semiconductor element and a second semiconductor element whose gates are driven by the driving apparatus.

The first semiconductor element and the second semiconductor element may be wide bandgap semiconductor elements.

A third aspect of the present invention may provide a driving apparatus. The driving apparatus may include a gate driving circuit to drive gates of a first semiconductor element and a second semiconductor element connected in series between a positive side power supply line and a negative side power supply line. The driving apparatus may include a first timing generating circuit to generate a first timing signal when voltage applied to the first semiconductor element becomes higher than or equal to the reference voltage during a turn-off period of the first semiconductor element. The driving apparatus may include a first driving condition change circuit where the gate driving circuit relaxes change in charge amount of the gate of the first semiconductor element, according to the first timing signal.

The first timing generating circuit may be pre-adjusted so as to generate the first timing signal when, after receiving a control signal to turn off the first semiconductor element and starting turn-off of the first semiconductor element, time reaches a timing before voltage applied to the first semiconductor element becomes higher than or equal to the reference voltage.

The reference voltage may be higher than or equal to voltage between the positive side power supply line and the negative side power supply line.

A fourth aspect in the present invention may provide a driving apparatus. The driving apparatus may include a gate driving circuit to drive gates of a first semiconductor element and a second semiconductor element connected in series between a positive side power supply line and a negative side power supply line. The driving apparatus may include a first timing generating circuit to generate a first timing signal when commutation into the second semiconductor element starts, during a turn-off period of the first semiconductor element. The driving apparatus may include a first driving condition change circuit to relax change in charge amount of the gate of the first semiconductor element by the gate driving circuit, according to the first timing signal.

The first timing generating circuit may be pre-adjusted so as to generate the first timing signal when, after receiving a control signal to turn off the first semiconductor element and starting turn-off of the first semiconductor element, time reaches a timing before commutation into the second semiconductor element starts.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
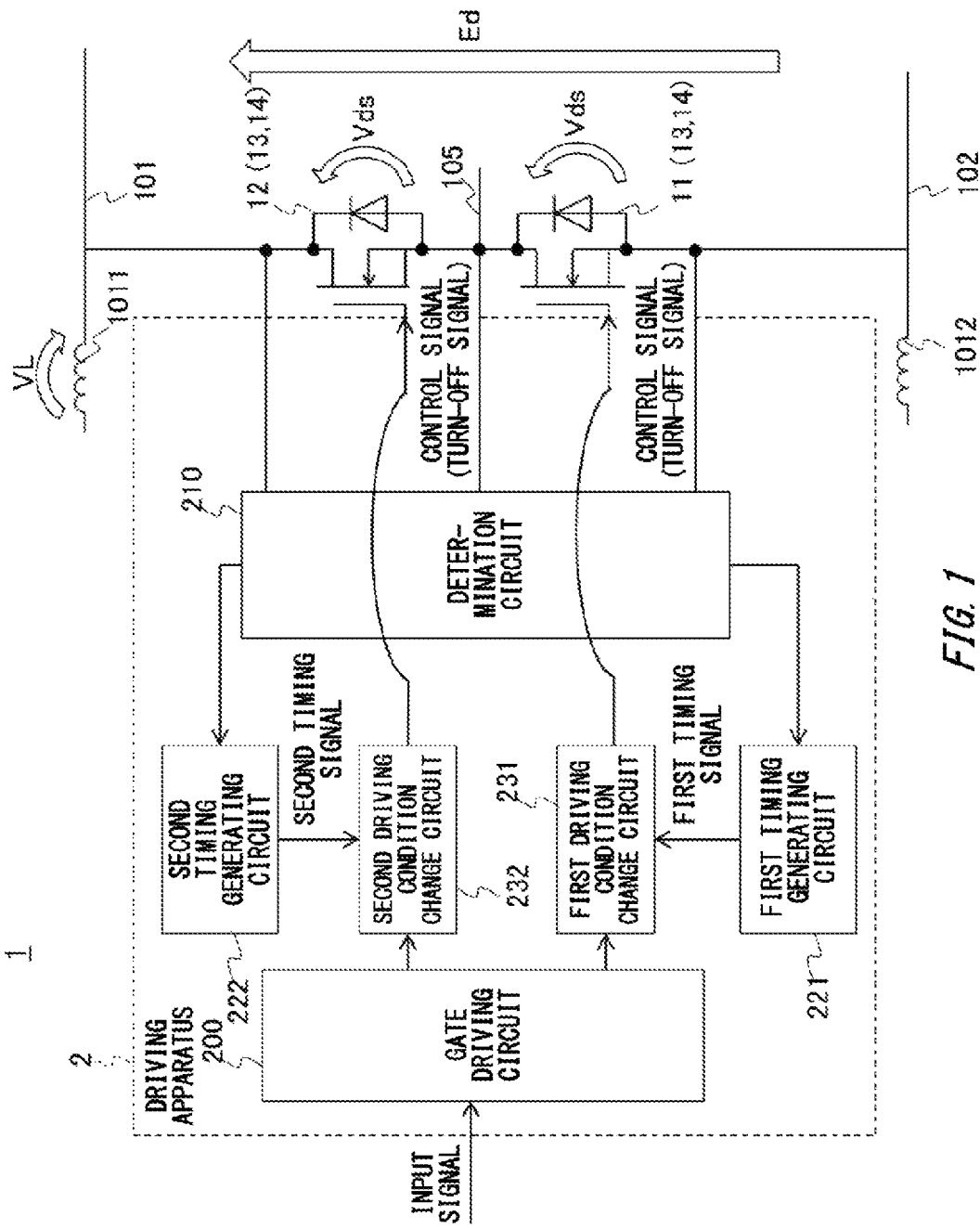
FIG. 1 shows a switching apparatus according to the present embodiment.

FIG. 1 shows a switching apparatus 1 according to the present embodiment. Note that, outline arrows represent voltage in the figure.

The switching apparatus 1 shows a portion of one phase of a power conversion apparatus used for driving motors or supplying electric power, as one example, and output voltage converted from a power supply output terminal 105 by switching connections among a positive side power supply line 101, a negative side power supply line 102, and a power supply output terminal 105.

Here, between the positive side power supply line 101 and the negative side power supply line 102, direct current voltage Ed such as 600 to 800 V for example is applied. Also, the positive side power supply line 101 and the negative side power supply line 102 may have wiring inductances 1011, 1021 depending on their respective wiring lengths.

Switching apparatus 1 includes a first semiconductor element 11 and a second semiconductor element 12, and a driving apparatus 2.

The first semiconductor element 11 and the second semiconductor element 12 are connected sequentially in series between the negative side power supply line 102 and the positive side power supply line 101. The power supply output terminal 105 may be connected at the midpoint of the first semiconductor element 11 and the second semiconductor element 12.

The first semiconductor element 11 and the second semiconductor element 12 are switching elements which can be switched on and off by the driving apparatus 2 to be described below. As one example, the first semiconductor element 11 and the second semiconductor element 12 constitute a lower arm and an upper arm of the power conversion apparatus.

The first semiconductor element 11 and the second semiconductor element 12 are silicon semiconductor elements, the base material of which is silicon. Also, they are not limited to the silicon semiconductor elements, but may be wide bandgap semiconductor elements. The wide bandgap semiconductor element is a semiconductor element that has greater bandgap than that of the silicon semiconductor element, for example, a semiconductor element including SiC, GaN, diamond, gallium nitride-based material, gallium oxide-based material, AlN, AlGaN, ZnO, or the like. A switching speed can be more improved in case using the wide bandgap semiconductor element than in case using the silicon semiconductor element.

Also, in this embodiment, the first semiconductor element 11 and the second semiconductor element 12 are MOSFET and have a parasitic diode whose cathode is closer to the positive side power supply line 101 (shown in FIG. 1). Note that, for the first semiconductor element 11 and the second semiconductor element 12, semiconductor elements having other structures such as an IGBT or a bipolar transistor can be also applied, and diodes, schottky barrier diodes etc. are connected in inverse-parallel to the respective semiconductor elements, according to need.

The driving apparatus 2 drives the first semiconductor element 11 and the second semiconductor element 12 based on an input signal. For example, when switching the first semiconductor element 11 and the second semiconductor element 12 into ON state alternately, the driving apparatus 2, after turning off one element to switch it into OFF state, turns on the other element. Here, out of the first semiconductor element 11 and the second semiconductor element 12, an element for turning off is referred to as a turn-off target element 13, whereas an element for being maintained in OFF state is referred to as an opposite arm element 14. During a turn-off period (i.e. a period from a start of turn-off until its completion, as one example, in the present embodiment), the driving apparatus 2, reduces turn-off loss and also maintains and reduces surge voltage, by switching a changing speed of gate charge of the turn-off target element 13, that is, switching a changing speed of gate voltage (Vgs) which is gate-source voltage of the turn-off target element 13.

The driving apparatus 2 includes a gate driving circuit 200, a determination circuit 210, a first timing generating circuit 221 and a second timing generating circuit 222, and, a first driving condition change circuit 231 and a second driving condition change circuit 232.

The gate driving circuit 200 drives the gates of the first semiconductor element 11 and the second semiconductor element 12 based on the input signal. The gate driving circuit 200 may supply, via the first driving condition change circuit 231, a control signal for the first semiconductor element 11 to the gate of the first semiconductor element 11. Also, the gate driving circuit 200 may supply, via the second driving condition change circuit 232, a control signal for the second semiconductor element 12 to the gate of the second semiconductor element 12. A control signal output for the turn-off target element 13 during the turn-off period is a turn-off signal to turn off the turn-off target element 13. For example, the turn-off signal switches the turn-off target element from ON state to OFF state, by charging, in the reverse bias direction (−Vgs direction), gate input capacitance $Cgs_{(13)}$ of the turn-off target element 13 in ON state.

Here, during the turn-off period of the second semiconductor element 12, with drain-source voltage $Vds_{(12)}$ of the second semiconductor element 12 increasing up to the direct current voltage Ed between the positive side power supply line 101 and the negative side power supply line 102, drain-source voltage $Vds_{(11)}$ of the first semiconductor element 11 is reduced and eventually becomes zero. However, at this time, discharge from the parasitic capacitance of the first semiconductor element 11 is prevented by the wiring inductance 1011 of the positive side power supply line 101, voltage $Vds_{(11)}$ of the first semiconductor element 11 does not become zero yet, even when the voltage $Vds_{(12)}$ of the second semiconductor element 12 becomes the direct current voltage Ed. Similarly, during the turn-off period of the first semiconductor element 11, with drain-source voltage $Vds_{(11)}$ of the first semiconductor element 11 increasing up to the direct current voltage Ed, drain-source voltage $Vds_{(12)}$ of the second semiconductor element 12 is reduced and eventually becomes zero. However, at this time, discharge from the parasitic capacitance of the second semiconductor element 12 is prevented by the wiring inductance 1021 of the negative side power supply line 102, the voltage $Vds_{(12)}$ of the second semiconductor element 12 does not become zero yet, even when voltage $Vds_{(11)}$ of the first semiconductor element 11 becomes the direct current voltage Ed. Thus, a determination circuit 210 is provided in the driving apparatus 2 in the present embodiment.

The determination circuit 210 determines whether voltage $Vds_{(14)}$ applied to the opposite arm element 14 has become lower than or equal to the reference voltage or not, during the turn-off period. For example, the determination circuit 210 may determine whether voltage $Vds_{(14)}$ applied to the second semiconductor element 12 becomes lower than or equal to the reference voltage or not, during the turn-off period of the first semiconductor element 11. Additionally or alternatively to this, the determination circuit 210 may determine whether voltage $Vds_{(11)}$ applied to the first semiconductor element 11 becomes lower than or equal to the reference voltage or not, during the turn-off period of the second semiconductor element 12.

Here, the reference voltage may be voltage which is smaller than voltage $Vds_{(14)}$ applied to the opposite arm element 14 at the time when drain-source voltage $Vds_{(13)}$ of the turn-off target element 13 becomes the direct current voltage Ed between the positive side power supply line 101 and the negative side power supply line 102. For example, the reference voltage may be drain-source voltage $Vds_{(14)}$ at the timing when drain current in the opposite arm element 14 starts commutation into the parasitic diode or a diode connected in inverse-parallel. In the present embodiment, as one example, the reference voltage is 0 V, or 0 V excluding error. If seen from the turn-off target element 13, the reference voltage is higher than or equal to the direct current voltage Ed in value. Note that, in the present embodiment, identifying and determining may be performed using the reference voltage, but, as described above, identifying and determining can be performed using commutation of the parasitic diode or the diode connected in inverse-parallel.

The determination circuit 210 may supply, to the first timing generating circuit 221, a determination result whether voltage $Vds_{(12)}$ applied to the second semiconductor element 12 has become lower than or equal to the reference voltage or not, during the turn-off period of the first semiconductor element 11. Also, the determination circuit 210 may supply, to the second timing generating circuit 222, a determination result whether voltage $Vds_{(11)}$ applied to the first semiconductor element 11 becomes lower than or equal to the reference voltage or not, during the turn-off period of the second semiconductor element 12.

The first timing generating circuit 221 generates a first timing signal when voltage $Vds_{(12)}$ applied to the second semiconductor element 12 is lowered to the reference voltage, during the turn-off period of the first semiconductor element 11. For example, the first timing generating circuit 221 may generate a first timing signal according to determination, by the determination circuit 210, that the voltage $Vds_{(12)}$ applied to the second semiconductor element 12 has become lower than or equal to the reference voltage. The first timing generating circuit 221 may supply the first timing signal to the first driving condition change circuit 231.

The second timing generating circuit 222 generates a second timing signal in accordance with the timing when voltage $Vds_{(11)}$ applied to the first semiconductor element 11 is reduced and becomes lower than or equal to the reference voltage during the turn-off period of the second semiconductor element 12. For example, the second timing generating circuit 222 may generate a second timing signal, according to determination, by the determination circuit 210, that the voltage $Vds_{(11)}$ applied to the first semiconductor element 11 has become lower than or equal to the reference voltage. The second timing generating circuit 222 may supply the second timing signal to the second driving condition change circuit 232.

The first driving condition change circuit 231 relaxes change in gate charge amount of the first semiconductor element 11 according to the gate driving circuit 200, according to the first timing signal during the turn-off period of the first semiconductor element 11. For example, the first driving condition change circuit 231, until receiving a first timing signal, may supply the turn-off signal supplied from the gate driving circuit 200 as it is to the gate of the first semiconductor element 11. Also, the first driving condition change circuit 231, after receiving the first timing signal, may supply the turn-off signal after correcting it so as to reduce an absolute value of a changing speed of gate voltage, in other word, an injection speed of charge to the gate of the first semiconductor element 11. As one example, the first driving condition change circuit 231 may reduce current of the turn-off signal, reduce voltage of the turn-off signal, or stop the turn-off signal. To reduce current of the turn-off signal, for example, an internal path of the turn-off signal toward the gate may be made divided into paths to divide the current. To reduce voltage of the turn-off signal, a gate resistance of the first semiconductor element 11 may be made increased, for example by switching the internal path of the turn-off signal toward the gate from a path having a small resistance value to a path having a big resistance value etc. Note that the first driving condition change circuit 231 may reduce a gate charge changing speed of the first semiconductor element 11 according to the gate driving circuit 200, according to a pre-set timing. The pre-set timing is the same as a timing to receive the first timing signal. Also, the first timing signal may be generated according to signal delay time etc., or may be generated at a calculated timing to generate the first timing signal.

The second driving condition change circuit 232, like the first driving condition change circuit 231, reduces a speed at which the gate driving circuit 200 changes charge of the gate of second semiconductor element 12, according to the second timing signal, during the turn-off period of the second semiconductor element 12.

According to the switching apparatus 1 described above, during the turn-off period of the turn-off target element 13 (the first semiconductor element 11, as one example), a timing signal is generated in accordance with the timing when voltage $Vds_{(14)}$ applied to the opposite arm element 14 (the second semiconductor element 12, as one example) is reduced and becomes lower than or equal to the reference voltage (0 V, as one example), and according to this signal, the gate charge changing speed of the turn-off target element 13 is made reduced. That is, until voltage $Vds_{(14)}$ of the opposite arm element 14 becomes the reference voltage, the changing speed of the gate charge of the turn-off target element 13 is increased, whereas the changing speed is reduced when it is lower than or equal to the reference voltage. Accordingly, the turn-off loss can be reduced by making turn-off period shorter, as compared with the case where the charge changing speed is made reduced when the voltage $Vds_{(14)}$ applied to the opposite arm element 14 is greater than the reference voltage. Also, when the voltage $Vds_{(14)}$ of the opposite arm element 14 becomes lower than or equal to the reference voltage, changing speed of the gate charge is reduced, so that the surge voltage can be reduced.

Figure 2:
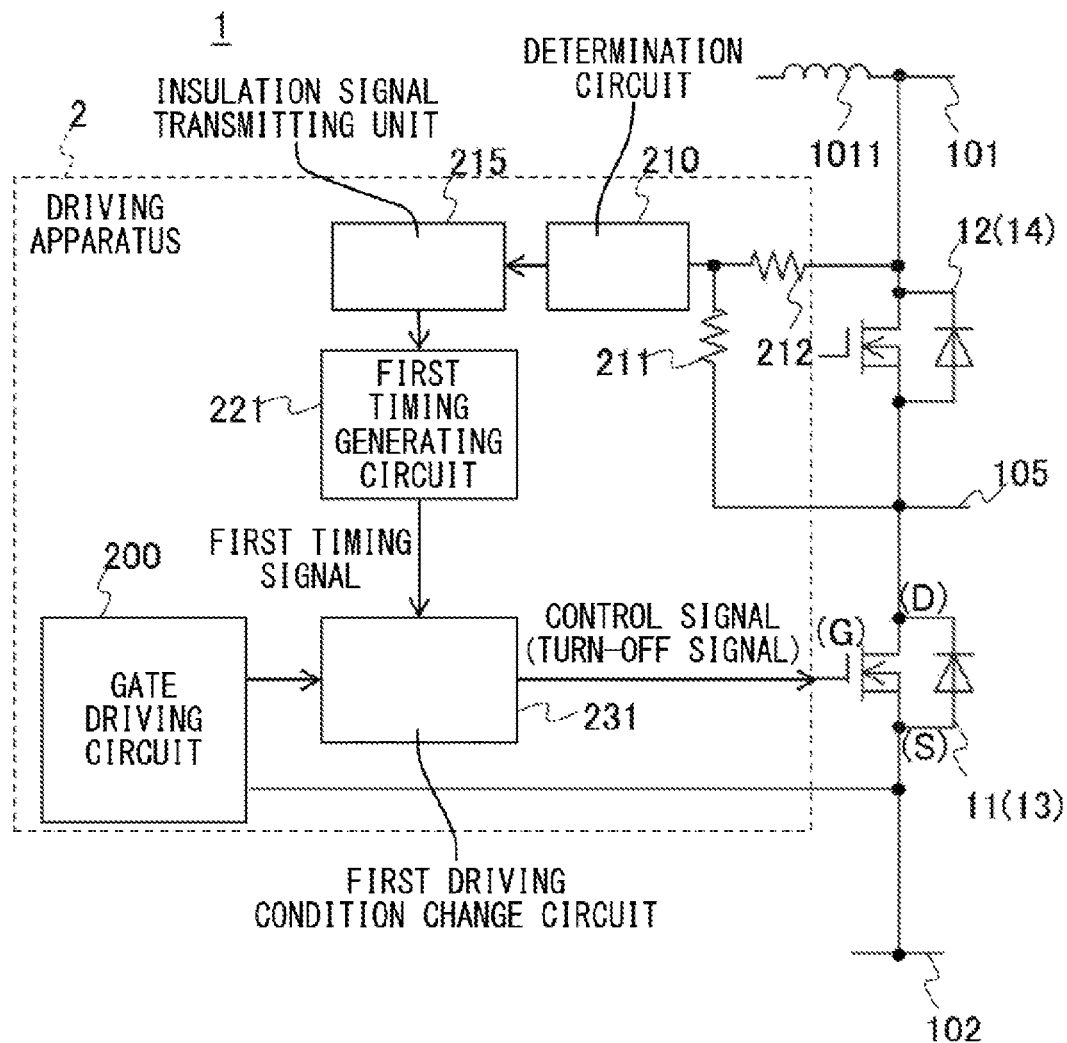
FIG. 2 shows detail of the switching apparatus.

FIG. 2 shows detail of the switching apparatus 1. Note that, in FIG. 2, only a configuration related to turn-off of the first semiconductor element 11 is shown in the configuration shown in FIG. 1, but it does not matter if there is a configuration related to turn-off of the second semiconductor element 12 or not.

The driving apparatus 2, in addition to the configuration shown in FIG. 1, may further include resistances 211, 212 and an insulation signal transmitting unit 215.

The resistances 211, 212 divide drain-source voltage $Vds_{(12)}$ of the second semiconductor element 12, which is the opposite arm element 14. The resistances 211, 212 are connected in parallel to the second semiconductor element 12, and between the resistances 211, 212 is connected a determination circuit 210.

The determination circuit 210 may determine whether voltage $Vds_{(12)}$ applied to the second semiconductor element 12 has become lower than or equal to the reference voltage or not, during the turn-off period of the first semiconductor element 11. The determination circuit 210 may supply a determination result to the insulation signal transmitting unit 215.

The insulation signal transmitting unit 215 is provided between the determination circuit 210 and the first driving condition change circuit 231. The insulation signal transmitting unit 215 may convert signal voltage from the determination circuit 210 and supply it to the first timing generating circuit 221.

According to the switching apparatus 1 described above, during the turn-off period of the first semiconductor element 11, a timing signal is generated in accordance with the timing when voltage $Vds_{(12)}$ applied to the second semiconductor element 12 is reduced and becomes lower than or equal to the reference voltage, and according to this signal, the gate charge changing speed of the first semiconductor element 11 is made reduced.

Figure 3:
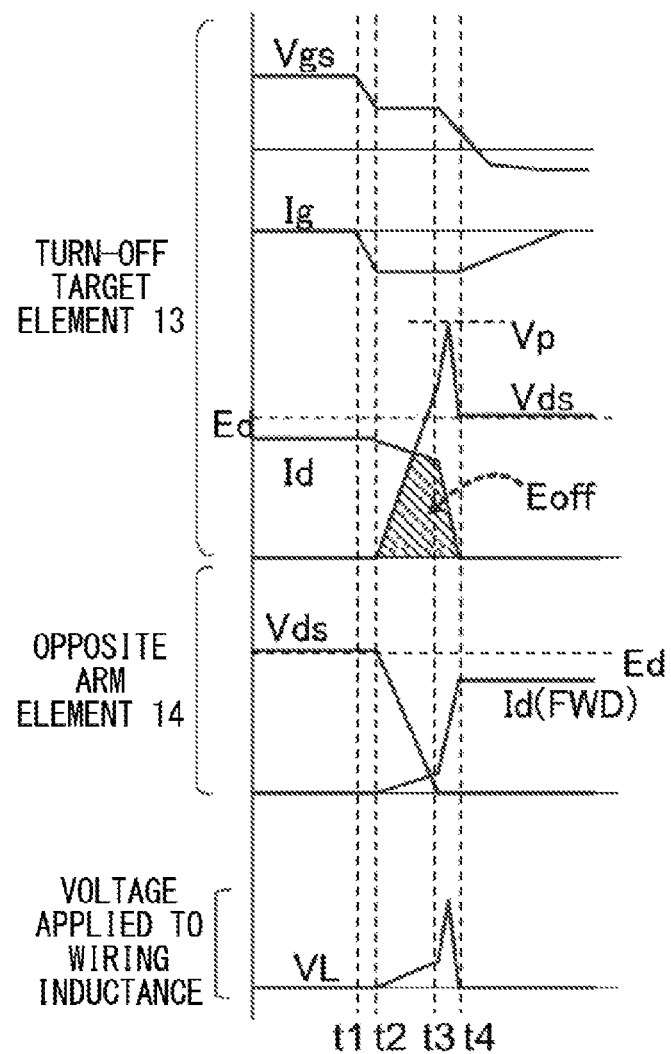
FIG. 3 shows an exemplary operating waveform according to the switching apparatus in a comparative example during turn-off.

FIG. 3 shows an exemplary operating waveform, during turn-off, according to the switching apparatus in a comparative example in the present embodiment. Note that, in this switching apparatus, a turn-off signal output from the gate driving circuit is supplied as it is to the gate of the turn-off target element 13.

First, at time t1, negative gate current $Ig_{(13)}$ starts flowing. Thereby, a turn-off signal from the gate driving circuit is output, and injection of the gate charge into the turn-off target element 13 in a reverse bias direction is started. Then, during a period time t1 to time t2, gate input capacitance $Cgs_{(13)}$ of the turn-off target element 13 is charged in the reverse bias direction, and gate source voltage $Vgs_{(13)}$ is reduced.

Next, when gate source voltage $Vgs_{(13)}$ is reduced to the mirror voltage (at time t2), most of the gate charge is used to charge feedback capacitance (gate-drain capacitance) $Cgd_{(13)}$, change of gate source voltage $Vgs_{(13)}$ becomes flat (so-called a mirror period), and drain-source voltage $Vds_{(13)}$ of the turn-off target element 13 is increased.

Accordingly, since drain-source voltage $Vds_{(14)}$ is lowered and discharge current flows from the parasitic capacitance $Cds_{(14)}$ of the opposite arm element 14, drain current $Id_{(13)}$ is reduced and voltage VL depending on the current change amount is applied to the wiring inductance 101l of the positive side power supply line 101.

Then, when drain-source voltage $Vds_{(14)}$ of the opposite arm element 14 becomes zero at time t3, load current IL flowing to the power supply output terminal 105 commutates into the parasitic diode of the opposite arm element 14, and, at the same time, the mirror period ends at the turn-off target element 13, and then drain current $Id_{(13)}$ is rapidly is reduced (and becomes zero at time t4). Thereby, voltage VL applied to the wiring inductance 101l of the positive side power supply line 101 increases instantaneously, and drain-source voltage $Vds_{(13)}$ of the turn-off target element 13 increases to the peak voltage Vp. After that, it becomes the direct current voltage Ed at time t4.

Then, during a period after time t4, the charge into the gate input capacitance $Cgs_{(13)}$ of the turn-off target element 13 ends and the turn-off of the turn-off target element 13 is completed. Although not shown in FIG. 3, when turn-off of the turn-off target element 13 is completed, turn on of the opposite arm element 14 is performed.

Figure 4:
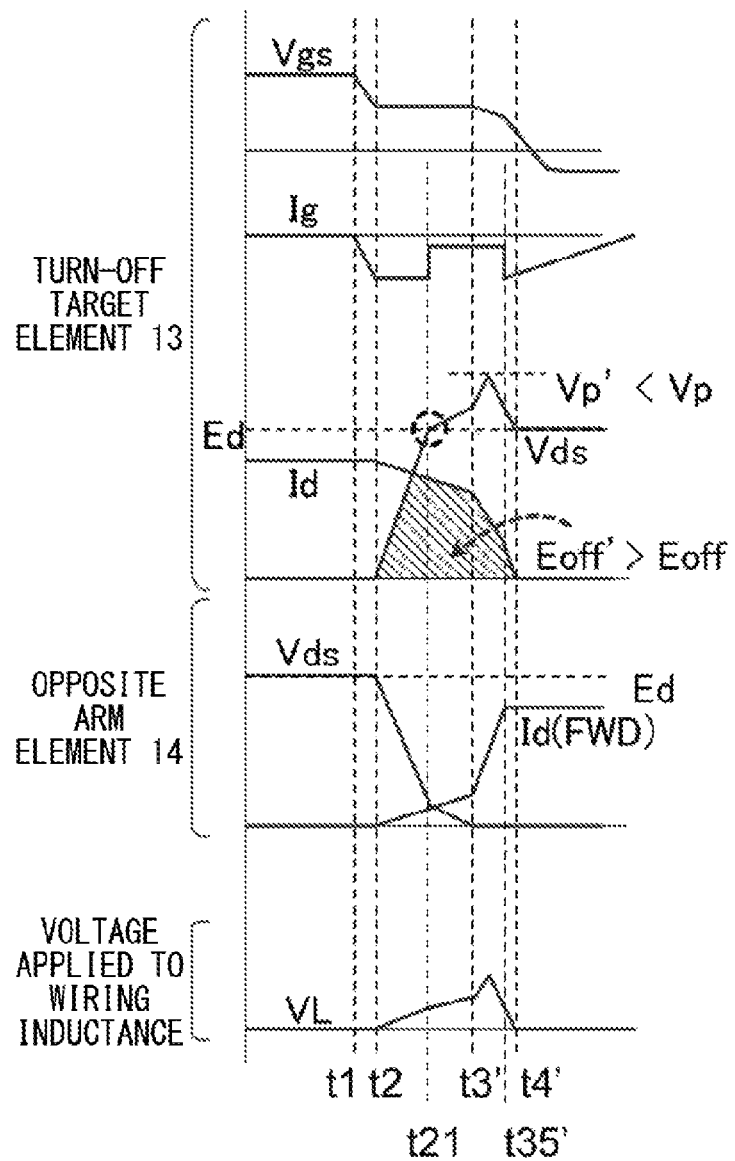
FIG. 4 shows an exemplary operating waveform according to the switching apparatus in another comparative example during turn-off.

FIG. 4 shows an exemplary operating waveform, during turn-off, according to the switching apparatus in another comparative example in the present embodiment. Note that, in this switching apparatus, a turn-off signal output from the gate driving circuit is supplied as it is, up to time t21 to be described below, to the gate of the turn-off target element 13. Also, after time t21, a turn-off signal is corrected and supplied to the turn-off target element 13.

First, during a period from time t1 to time t2, operation is performed so as to obtain an operating waveform similar to that in FIG. 3.

Then, when drain-source voltage $Vds_{(13)}$ of the turn-off target element 13 increases and become equal to the direct current voltage Ed between the positive side power supply line 101 and the negative side power supply line 102 at time t21 in the figure (refer to a broken line frame in the figure), the turn-off signal is corrected during a period from time t21 to time t35' and the gate charge changing speed of the turn-off target element 13 is made lowered. For example, gate current $Ig_{(13)}$ is controlled at a negative constant value closer to zero.

Here, at time t21, as described above, due to an influence of discharge current from the parasitic capacitance of the opposite arm element 14, voltage VL is generated on the wiring inductance 1011 of the positive side power supply line 101, drain-source voltage $Vds_{(14)}$ does not become zero and, at the turn-off target element 13, the mirror period continues. When reducing the changing speed of the gate charge (i.e. reducing gate current Ig in the negative direction) at this timing, since an injection amount of the gate charge into the reverse bias direction is reduced, an increasing speed dv/dt of drain-source voltage $Vds_{(13)}$ is reduced.

Then, when drain-source voltage $Vds_{(14)}$ of the opposite arm element 14 becomes zero, at time t3', where t3'>t3, the load current IL commutates into the parasitic diode of the opposite arm element 14, and, at the same time, the mirror period ends at the turn-off target element 13, and then drain current $Id_{(13)}$ is rapidly reduced (and becomes zero at time t4', where t4'>t4). Thereby, voltage VL applied to the wiring inductance 1011 of the positive side power supply line 101 increases instantaneously, and drain-source voltage $Vds_{(13)}$ of the turn-off target element 13 increases to peak voltage Vp'. Here, in the operating waveform in FIG. 4, the peak voltage Vp' is smaller than the peak voltage Vp, by reducing the changing speed of the gate charge during a period from time t21 to time t35'. After that, it becomes the direct current voltage Ed at time t4'.

Then, during a period after time t4', the charge into the gate input capacitance $Cgs_{(13)}$ of the turn-off target element 13 ends and the turn-off of the turn-off target element 13 is completed.

Also, turn-off loss Eoff' which is conceptually shown as a shaded region in the operating waveform in FIG. 4 is greater than the turn-off loss Eoff in FIG. 3. This is because, in the operating waveform in FIG. 4, as compared with the operating waveform in FIG. 3, the reduction speed of drain current $Id_{(13)}$ is small during a period from time t21 to time t3', and a period from time t2 to t4' is longer than a period from time t2 to time t4.

Figure 5:
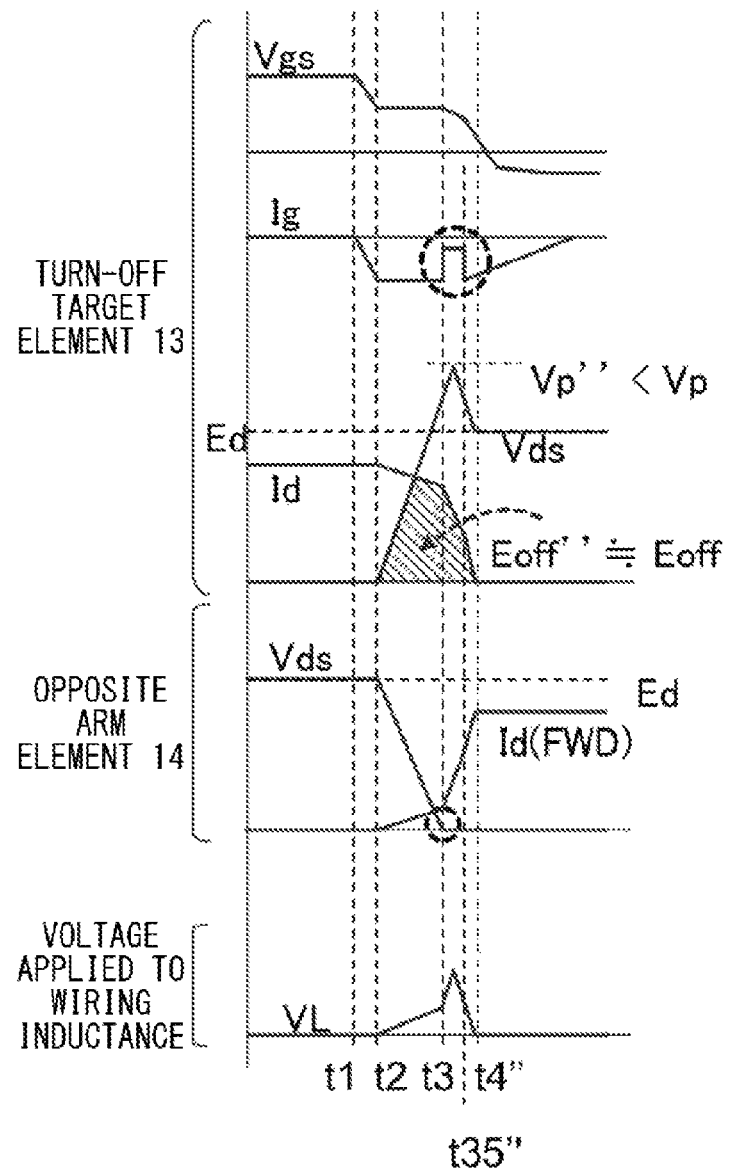
FIG. 5 shows an exemplary operating waveform of according to the switching apparatus according to the present embodiment during turn-off.

FIG. 5 shows an exemplary operating waveform of the switching apparatus 1 according to the present embodiment during turn-off. Note that, in this switching apparatus 1, a turn-off signal output from the gate driving circuit is supplied as it is, up to a timing of time t3, to the gate of the turn-off target element 13. Also, after the timing of time t3, the turn-off signal is corrected and supplied to the turn-off target element 13.

First, during a period from time t1 to time t3, operation is performed so as to obtain operating waveform similar to that in FIG. 3.

Then, when drain-source voltage $Vds_{(14)}$ of the opposite arm element 14 becomes zero (refer to a broken line frame below in the figure) at time t3, the first timing generating circuit 221 generates the first timing signal having a predetermined pulse width. According to this, the first driving condition change circuit 231, while the first timing signal is generated after receiving the first timing signal, corrects the turn-off signal and reduces the gate charge changing speed of the first semiconductor element 11 (refer to a broken line frame above in the figure). For example, the gate current $Ig_{(13)}$ is controlled at a negative constant value closer to zero. Note that, in the present embodiment, as one example, a period when the first timing signal is generated may be a period from time t3 to time t35", and time t35" may be before time t4" to be described below when the turn-off of the turn-off target element 13 ends.

Here, at time t3, drain-source voltage $Vds_{(14)}$ has become zero at the opposite arm element 14, and the mirror period has ended at the turn-off target element 13. Thus, while gate source voltage $Vgs_{(13)}$ starts being reduced again, drain current $Id_{(13)}$ is rapidly reduced and becomes zero at time t4", where t4"≥t4.

When drain-source voltage $Vds_{(14)}$ becomes zero, the load current IL commutates into the parasitic diode of the opposite arm element 14, and, at the same time, the mirror period ends at the turn-off target element 13, and then drain current $Id_{(13)}$ is rapidly reduced. Thereby, voltage VL applied to the wiring inductance 1011 of the positive side power supply line 101 increases instantaneously, and drain-source voltage $Vds_{(13)}$ of the turn-off target element 13 increases to peak voltage Vp". Here, the operating waveform in FIG. 5, the peak voltage Vp" is smaller than the peak voltage Vp, by reducing the changing speed of the gate charge during period from time t3 to time t35". After that, drain-source voltage $Vds_{(13)}$ becomes the direct current voltage Ed at time t4".

Then, during a period after time t4", the charge into the gate input capacitance $Cgs_{(13)}$ of the turn-off target element 13 ends and the turn-off of the turn-off target element 13 is completed.

In the operating waveform in FIG. 5, as compared to the operating waveform in FIG. 3, a period from time t2 when an OFF operation of the turn-off target element 13 starts to time t4" when drain current $Id_{(13)}$ of the turn-off target element 13 becomes zero, becomes slightly longer, but, as described above, surge voltage peak value Vp" becomes smaller. Thus, turn-off loss Eoff" in the operating waveform in FIG. 5 is approximately as big as the turn-off loss Eoff in FIG. 3.

Note that, in the embodiment described above, it has been described that the first timing generating circuit 221 and the second timing generating circuit 222 generate timing signals when voltage applied to the opposite arm element is lowered to the reference voltage, but they may generate timing signals when commutation into the opposite arm element starts. For example, the first timing generating circuit 221 and the second timing generating circuit 222 may generate timing signals when drain current starts commutation into the parasitic diode opposite arm element or the diode connected in inverse-parallel. As one example, the first timing generating circuit 221 and the second timing generating circuit 222 may generate timing signals when starting of the commutation is indicated by a measurement result which was obtained by measuring the amount of the current flowing in the parasitic diode by a current sensor.

Also, it has been described that reference voltage used to generate the first timing signal is drain-source voltage $Vds_{(14)}$ when drain current $Id_{(14)}$ in the opposite arm element 14 starts commutation into the parasitic diode, but, it may be other voltage. For example, the reference voltage may be drain-source voltage $Vds_{(14)}$ at the time when drain-source voltage $Vds_{(13)}$ of the turn-off target element 13 is higher than the direct current voltage Ed between the positive side power supply line 101 and the negative side power supply line 102. The reference voltage may be higher than or equal to voltage between the positive side power supply line 101 and the negative side power supply line 102. Also, the reference voltage may be less than voltage VL applied to the wiring inductance 1011 of the positive side power supply line 101 at these timings.

Also, it has been described that the first timing generating circuit 221 and the second timing generating circuit 222 generate timing signals based on determination results etc., and the like by the determination circuit 210, but they may generate timing signals at fixed timings. For example, at least one of the first timing generating circuit 221 and the second timing generating circuit 222 may be pre-adjusted so as to generate timing signal when, after receiving a turn-off signal and starting turn-off of the turn-off target element 13, the time reaches a timing before voltage applied to the opposite arm element 14 is reduced and becomes lower than or equal to the reference voltage, a timing before commutation into the opposite arm element starts, or a timing before voltage applied to the turn-off target element 13 becomes higher than or equal to the reference voltage. Such period may be measured prior to shipment of the switching apparatus 1 and set in the first timing generating circuit 221 and/or the second timing generating circuit 222. In this case, the determination circuit 210 can be eliminated and the switching apparatus 1 can be simplified.

What is claimed is:

1. A driving apparatus comprising:
   gate driving circuit to drive gates of a first semiconductor element and a second semiconductor element connected in series between a positive side power supply line and a negative side power supply line;
   a first timing generating circuit to generate a first timing signal starting when commutation of current into the second semiconductor element starts during a turn-off period of the first semiconductor element; and
   a first driving condition change circuit, wherein the gate driving circuit relaxes change in a charge amount of a gate of the first semiconductor element, during the generation of the first timing signal.

2. The driving apparatus according to claim 1, wherein the first timing generating circuit is pre-adjusted so as to generate the first timing signal when, after receiving a control signal to turn off the first semiconductor element and starting turn-off of the first semiconductor element, time reaches a timing before commutation into the second semiconductor element starts.

3. The driving apparatus according to claim 2, wherein the first driving condition change circuit is configured to (i) reduce current of the control signal, (ii) reduce voltage of the control signal or (iii) stop the control signal.

4. The driving apparatus according to claim 1, wherein the first timing generating circuit generates the first timing signal having a predetermined pulse width, and
   the first driving condition change circuit reduces a speed at which the gate driving circuit changes charge of a gate of the first semiconductor element, while the first timing signal is active.

5. The driving apparatus according to claim 4, wherein the first timing generating circuit ends generating the first timing signal before turn-off of the first semiconductor element ends.

6. A switching apparatus comprising:
   the driving apparatus according to claim 1; and
   the first semiconductor element and the second semiconductor element, whose gates are driven by the driving apparatus.

7. The switching apparatus according to claim 6, wherein the first semiconductor element and the second semiconductor element are wide bandgap semiconductor elements.

* * * * *